(12) United States Patent
Wu et al.

(10) Patent No.: US 11,532,552 B2
(45) Date of Patent: *Dec. 20, 2022

(54) METHOD AND APPARATUS FOR FORMING SELF-ALIGNED VIA WITH SELECTIVELY DEPOSITED ETCHING STOP LAYER

(71) Applicant: Taiwan Semiconductor Manufacturing Company, Ltd., Hsinchu (TW)

(72) Inventors: Yung-Hsu Wu, Taipei (TW); Hai-Ching Chen, Hsinchu (TW); Jung-Hsun Tsai, Taoyuan (TW); Shau-Lin Shue, Hsinchu (TW); Tien-I Bao, Dayuan Township (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/120,601

(22) Filed: Dec. 14, 2020

(65) Prior Publication Data

US 2021/0098362 A1     Apr. 1, 2021

Related U.S. Application Data

(60) Division of application No. 15/924,549, filed on Mar. 19, 2018, now Pat. No. 10,867,913, which is a
(Continued)

(51) Int. Cl.
*H01L 23/528* (2006.01)
*H01L 21/768* (2006.01)
(Continued)

(52) U.S. Cl.
CPC ........ *H01L 23/528* (2013.01); *H01L 21/0214* (2013.01); *H01L 21/0228* (2013.01);
(Continued)

(58) Field of Classification Search
CPC ......... H01L 21/76807; H01L 21/76802; H01L 21/76877; H01L 21/76879;
(Continued)

(56) References Cited

U.S. PATENT DOCUMENTS

| 6,331,479 B1 | 12/2001 | Li et al. |
| 7,667,271 B2 | 2/2010 | Yu et al. |

(Continued)

FOREIGN PATENT DOCUMENTS

| CN | 1783476 A | 6/2006 |
| CN | 101030566 A | 9/2007 |

(Continued)

*Primary Examiner* — Bac H Au
(74) *Attorney, Agent, or Firm* — Haynes and Boone, LLP

(57) ABSTRACT

A first layer is located over a substrate. The first layer includes a first dielectric component and a first conductive component. A first etching stop layer is located over the first dielectric component. A metal capping layer is located over the first conductive component. A second etching stop layer is located over the first etching stop layer and over the metal capping layer. A second layer is located over the second etching stop layer. The second layer includes a second dielectric component and a second conductive component. A third conductive component electrically interconnects the second conductive component to the first conductive component.

20 Claims, 15 Drawing Sheets

Related U.S. Application Data continuation of application No. 15/601,562, filed on May 22, 2017, now Pat. No. 9,922,927, which is a continuation of application No. 14/887,396, filed on Oct. 20, 2015, now Pat. No. 9,659,864.

(51) Int. Cl.
  *H01L 21/02* (2006.01)
  *H01L 21/033* (2006.01)
  *H01L 21/311* (2006.01)
  *H01L 23/522* (2006.01)
  *H01L 23/532* (2006.01)

(52) U.S. Cl.
  CPC .. *H01L 21/02126* (2013.01); *H01L 21/02282* (2013.01); *H01L 21/02348* (2013.01); *H01L 21/0337* (2013.01); *H01L 21/31144* (2013.01); *H01L 21/76802* (2013.01); *H01L 21/76807* (2013.01); *H01L 21/76877* (2013.01); *H01L 21/76885* (2013.01); *H01L 23/5226* (2013.01); *H01L 23/532* (2013.01)

(58) Field of Classification Search
  CPC ......... H01L 21/76832; H01L 21/76897; H01L 23/5226; H01L 21/76829
  See application file for complete search history.

(56) References Cited

U.S. PATENT DOCUMENTS

| | | | |
|---|---|---|---|
| 7,910,453 B2 | 3/2011 | Xu et al. | |
| 8,377,779 B1 | 2/2013 | Wang | |
| 8,399,931 B2 | 3/2013 | Liaw et al. | |
| 8,652,894 B2 | 2/2014 | Lin et al. | |
| 8,686,516 B2 | 4/2014 | Chen et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,772,109 B2 | 7/2014 | Collinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,860,148 B2 | 10/2014 | Hu et al. | |
| 9,520,321 B2 | 12/2016 | Ryan et al. | |
| 9,543,248 B2 * | 1/2017 | Xu | H01L 23/528 |
| 9,559,059 B2 | 1/2017 | Zhang et al. | |
| 9,659,864 B2 | 5/2017 | Wu et al. | |
| 9,922,927 B2 | 3/2018 | Wu et al. | |
| 10,229,876 B2 | 3/2019 | Kim et al. | |
| 2005/0001318 A1* | 1/2005 | Won | H01L 27/14636 257/751 |
| 2005/0110153 A1 | 5/2005 | Wu et al. | |
| 2006/0121733 A1* | 6/2006 | Kilpela | H01L 21/32051 438/681 |
| 2007/0102821 A1* | 5/2007 | Papa Rao | H01L 23/5222 257/758 |
| 2007/0210406 A1 | 9/2007 | Hirota et al. | |
| 2007/0290347 A1* | 12/2007 | Dostalik | H01L 21/76808 257/758 |
| 2008/0254600 A1* | 10/2008 | Liu | H01L 21/76831 438/494 |
| 2009/0197405 A1* | 8/2009 | Besling | H01L 21/76801 438/653 |
| 2010/0308463 A1* | 12/2010 | Yu | H01L 21/76849 257/753 |
| 2012/0153490 A1 | 6/2012 | Vannier | |
| 2012/0252210 A1* | 10/2012 | Tohnoe | C23C 16/52 438/658 |
| 2013/0277853 A1* | 10/2013 | Yang | H01L 21/76843 257/774 |
| 2014/0001574 A1 | 1/2014 | Chen et al. | |
| 2014/0084465 A1 | 3/2014 | Zhang et al. | |
| 2014/0110755 A1 | 4/2014 | Collinge | |
| 2014/0151812 A1 | 6/2014 | Liaw | |
| 2014/0210085 A1* | 7/2014 | Wang | H01L 23/5329 257/751 |
| 2015/0097293 A1 | 4/2015 | Yao et al. | |
| 2015/0123279 A1* | 5/2015 | Chi | H01L 23/53252 257/751 |
| 2015/0162280 A1 | 6/2015 | Pan et al. | |
| 2015/0171007 A1* | 6/2015 | Huang | H01L 21/02271 257/774 |
| 2015/0348835 A1* | 12/2015 | Deng | H01L 21/76849 257/751 |
| 2015/0357236 A1* | 12/2015 | Edelstein | H01L 21/76843 257/751 |
| 2016/0027738 A1 | 1/2016 | Murray et al. | |
| 2016/0111325 A1* | 4/2016 | JangJian | H01L 21/76877 257/774 |
| 2017/0047290 A1 | 2/2017 | Singh et al. | |
| 2017/0110397 A1 | 4/2017 | Wu et al. | |
| 2017/0256486 A1 | 9/2017 | Wu et al. | |
| 2018/0211911 A1 | 7/2018 | Wu et al. | |

FOREIGN PATENT DOCUMENTS

| | | |
|---|---|---|
| CN | 101286475 A | 10/2008 |
| CN | 101882610 A | 11/2010 |
| CN | 104051256 A | 9/2014 |

* cited by examiner

METHOD AND APPARATUS FOR FORMING SELF-ALIGNED VIA WITH SELECTIVELY DEPOSITED ETCHING STOP LAYER

PRIORITY DATA

This application is a divisional of U.S. patent application Ser. No. 15/924,549, filed Mar. 19, 2018, which is a continuation of U.S. patent application Ser. No. 15/601,562, filed May 22, 2017, now U.S. Pat. No. 9,922,927, which is a continuation of U.S. patent application Ser. No. 14/887,396, filed Oct. 20, 2015, now U.S. Pat. No. 9,659,864, the entire disclosures of which are incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

As a part of the semiconductor fabrication, conductive elements may be formed to provide electrical interconnections for the various components for an IC. For example, conductive vias for interconnecting different metal layers may be formed by etching openings in an interlayer dielectric (ILD) and filling the openings with a conductive material. However, as semiconductor fabrication technology nodes continue to evolve, critical dimensions and pitches are becoming smaller and smaller, and the process windows are becoming tighter. Consequently, overlay errors (e.g., misaligned via) may occur, which may lead to problems such as reduced reliability test margin or poor device performance.

Therefore, while conventional via formation processes have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
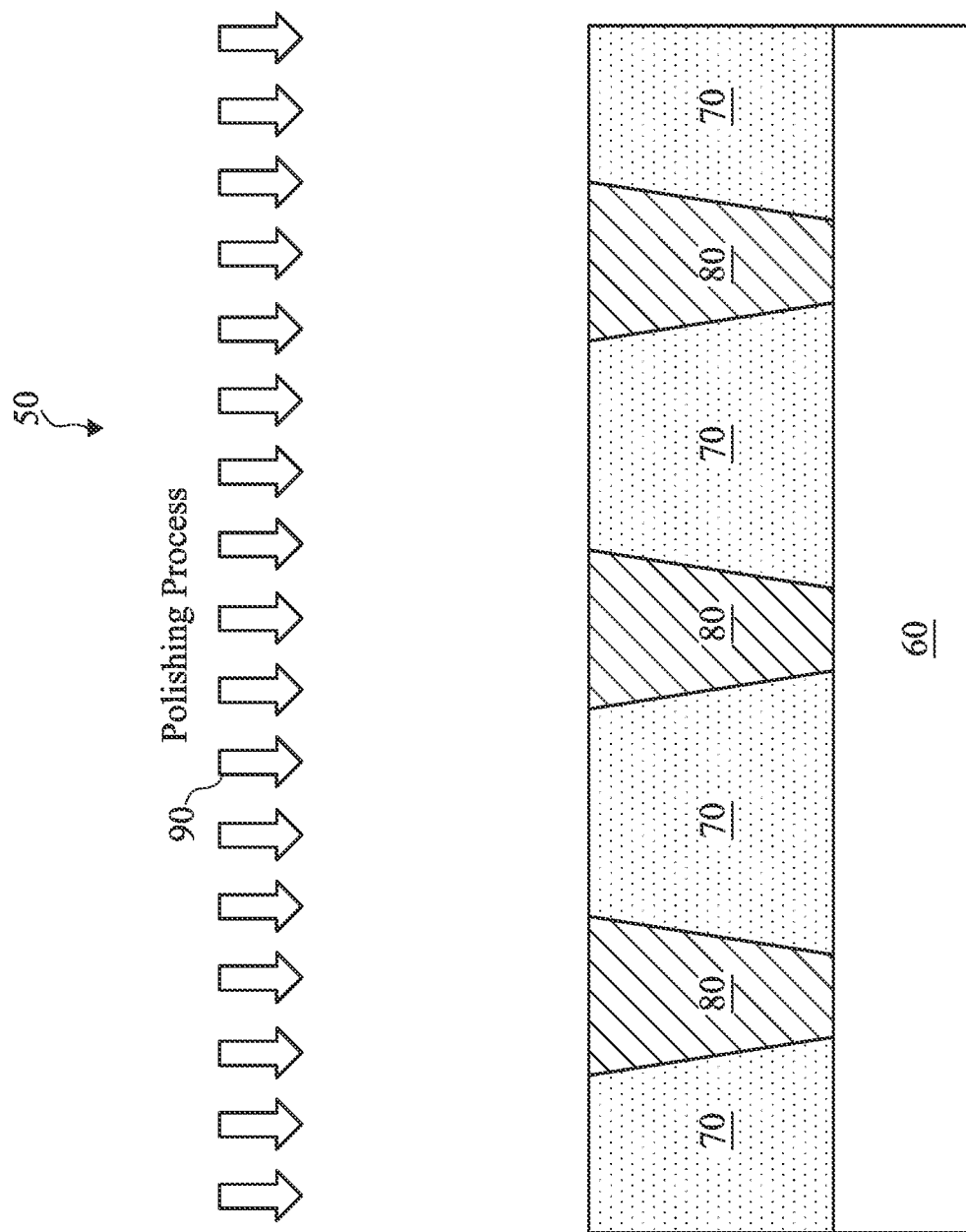
FIGS. 1-14 are diagrammatic cross-sectional side views of a semiconductor device at various stages of fabrication in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As a part of semiconductor fabrication, electrical interconnections need to be formed to electrically interconnect the various microelectronic elements (e.g., source/drain, gate, etc.) of the semiconductor device. Generally, this involves forming openings in layers (such as in electrically insulating layers), and subsequently filling these openings with an electrically conductive material. The electrically conductive material is then polished to form the electrical interconnections such as metal lines or vias.

However, as semiconductor technology generations continue the scaling-down process, accurate alignment or overlay may become problematic due to the ever-decreasing trench sizes. For example, it may be more difficult for vias to be accurately aligned with the desired metal lines above or below. When via misalignment or overlay problems occur, conventional methods of fabrication may lead to undesirable over-etching of a dielectric material (e.g., ILD) below the via opening. When the via opening is later filled with a metal material, its shapes resembles a tiger tooth. Such "tiger tooth" vias may lead to poor device performance. Tighter process windows may need to be used to avoid these problems, but that may degrade device performance as well.

To improve via alignment and to avoid over-etching of the ILD during the via formation, the present disclosure proposes a novel method and structure utilizing selective deposition of an etching stop layer to enlarge the process window without sacrificing performance. The various aspects of the present disclosure will now be discussed in more detail with reference to FIGS. 1-15.

FIGS. 1-4 are diagrammatic fragmentary cross-sectional side views of a semiconductor device 50 at various stages of fabrication in accordance with various aspects of the present disclosure. The semiconductor device 50 is fabricated under a semiconductor technology node that is 5-nanometers or lower. The semiconductor device 50 may include an integrated circuit (IC) chip, system on chip (SoC), or portion thereof, and may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors.

The semiconductor device 50 includes a substrate 60. In some embodiments, the substrate 60 is a silicon substrate doped with a p-type dopant such as boron (for example a p-type substrate). Alternatively, the substrate 60 could be another suitable semiconductor material. For example, the substrate 60 may be a silicon substrate that is doped with an n-type dopant such as phosphorous or arsenic (an n-type substrate). The substrate 60 could include other elementary semiconductors such as germanium and diamond. The substrate 60 could optionally include a compound semiconductor and/or an alloy semiconductor. Further, the substrate 60 could include an epitaxial layer (epi layer), may be strained for performance enhancement, and may include a silicon-on-insulator (SOI) structure.

In some embodiments, the substrate 60 is substantially conductive or semi-conductive. The electrical resistance may be less than about $10^3$ ohm-meter. In some embodiments, the substrate 60 contains metal, metal alloy, or metal nitride/sulfide/selenide/oxide/silicide with the formula MXa, where M is a metal, and X is N, S, Se, O, Si, and where "a" is in a range from about 0.4 to 2.5. For example, the substrate 60 may contain Ti, Al, Co, Ru, TiN, WN2, or TaN.

In some other embodiments, the substrate 60 contains a dielectric material with a dielectric constant in a range from about 1 to about 40. In some other embodiments, the substrate 60 contains Si, metal oxide, or metal nitride, where the formula is MXb, wherein M is a metal or Si, and X is N or O, and wherein "b" is in a range from about 0.4 to 2.5. For example, the substrate 60 may contain $SiO_2$, silicon nitride, aluminum oxide, hafnium oxide, or lanthanum oxide.

It is understood that a plurality of drains/sources may be formed in the substrate 60, and a plurality of gates may be formed over the substrate 60. For reasons of simplicity, however, these drains/sources or gates are not specifically illustrated herein.

A dielectric layer 70 is formed over the substrate 60. The dielectric layer 70 may be formed using a deposition process. In various embodiments, the dielectric layer 70 may contain a low-k dielectric material. A low-k dielectric material may refer to a dielectric material having a dielectric constant lower than the dielectric constant of silicon dioxide, which is about 3.9. As non-limiting examples, the low-k dielectric material may include fluorine-doped silicon dioxide, carbon-doped silicon dioxide, porous silicon dioxide, porous carbon-doped silicon dioxide, spin-on organic polymeric dielectric materials, or spin-on silicon based polymeric dielectric materials.

A plurality of conductive elements 80 are formed in the dielectric layer 70. The conductive elements 80 are also referred to as metal lines of a $M_X$ interconnect layer of a multilayered interconnect structure. The conductive elements 80 are formed by etching openings in the dielectric layer 70 and filling the openings with a conductive material. In some embodiments, the conductive material may contain copper or aluminum. A polishing process (such as chemical mechanical polishing) 90 is performed to polish the upper surfaces of the dielectric material 70 and the conductive elements 80.

Figure 2:
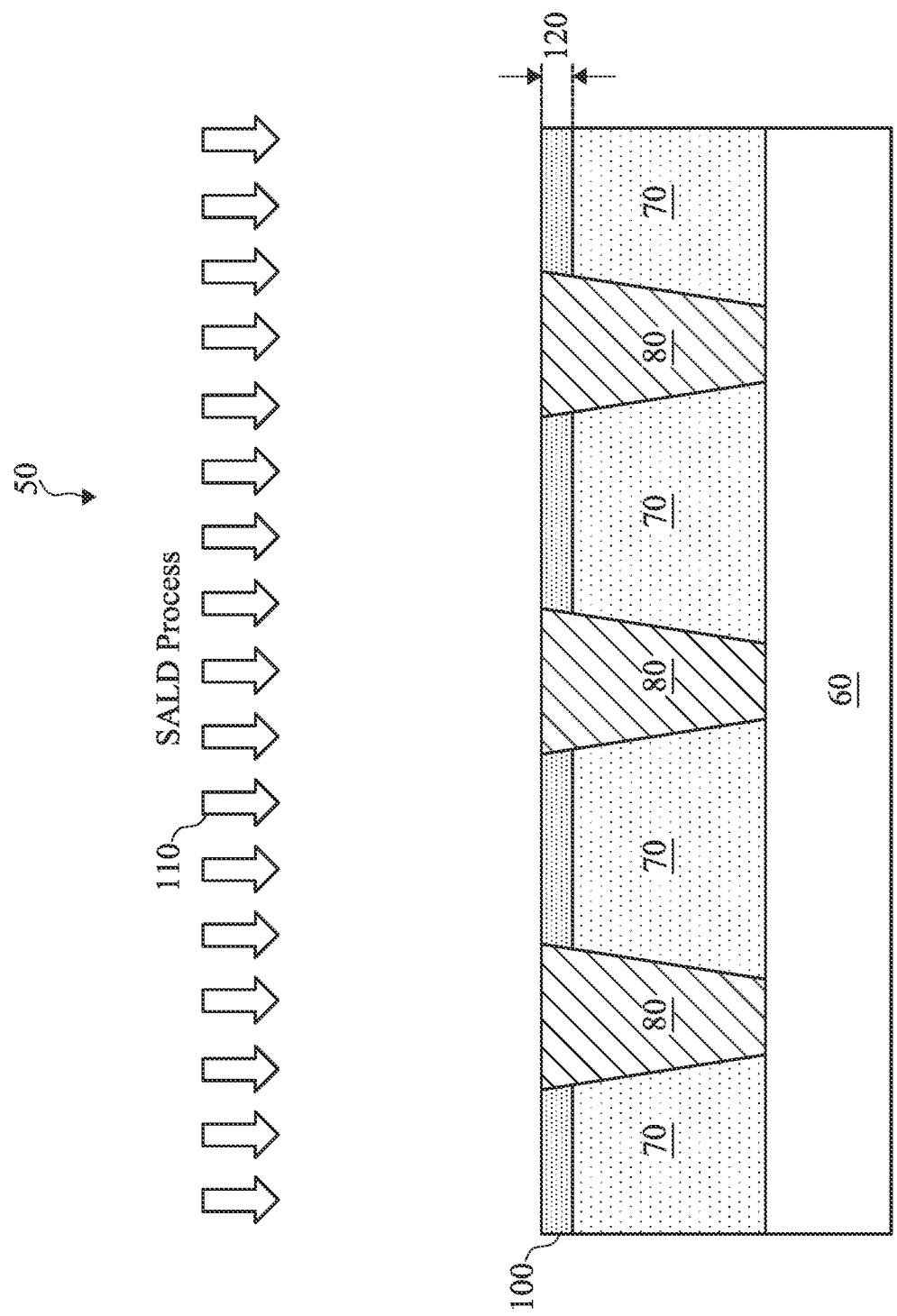

Referring now to FIG. 2, an etching stop layer 100 (also referred to as etching-stop layer or etch stop layer) is formed over the upper surfaces of dielectric layer 70, but not on the conductive elements 80. The etching stop layer 100 is formed to contain metal oxide. The etching stop layer is formed via a selective atomic layer deposition (SALD) process 110. In the SALD process 110, alternating cycles are performed. In one cycle, a precursor gas is turned on. In another cycle, an oxidant gas is turned on. These cycles are repeated for a number of times, which can be precisely controlled to grow a desired material of a desired thickness.

The process conditions of the SALD process 110 are as follows:

In one embodiment, the precursor gas includes Tetrakis-ethylmethylaminohafnium (TEMAHf):

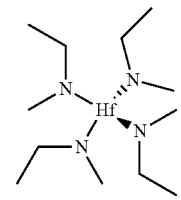

In this embodiment, the process temperature is in a range from about 200 degrees Celsius to about 400 degrees Celsius. The vapor pressure is about 0.1 torr at 70 degrees Celsius. The oxidant gas may contain $H_2O$, $(H_2+O_2)$, or $O_3$. As a result, hafnium oxide is formed as the material for the etching stop layer 100. The dielectric constant value of the etching stop layer 100 is about 18.5, its associated leakage current is about $4 \times 10^{-12}$ amps, and its associated electric breakdown strength (EBD) is about 7.4 millivolts per centimeter.

In another embodiment, the precursor gas includes tetrakis(ethylmethylamido)zirconium (TEMA-Zr):

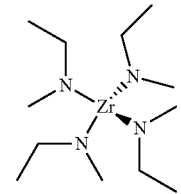

In this embodiment, the process temperature is in a range from about 200 degrees Celsius to about 400 degrees Celsius. The vapor pressure is about 0.1 torr at 70 degrees Celsius. The oxidant gas may contain $H_2O$, $(H_2+O_2)$, or $O_3$. As a result, zirconium oxide is formed as the material for the etching stop layer 100. The dielectric constant value of the etching stop layer 100 is about 20, its associated leakage current is about $1 \times 10^{-12}$ amps, and its associated electric breakdown strength (EBD) is about 5.6 millivolts per centimeter.

In yet another embodiment, the precursor gas includes Trimethyl Aluminum (TMA):

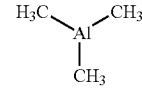

In this embodiment, the process temperature is in a range from about 200 degrees Celsius to about 400 degrees Celsius. The vapor pressure is about 100 torr at 70 degrees Celsius. The oxidant gas may contain $H_2O$, $(H_2+O_2)$, or $O_3$.

As a result, aluminum oxide is formed as the material for the etching stop layer 100. The dielectric constant value of the etching stop layer 100 is about 8.2, its associated leakage current is less than about $1 \times 10^{-12}$ amps, and its associated electric breakdown strength (EBD) is about 8.2 millivolts per centimeter.

In yet another embodiment, the precursor gas includes Tetrakis(dimethylamido) Aluminum (TDMAA):

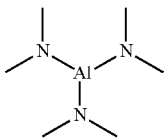

In this embodiment, the process temperature is in a range from about 200 degrees Celsius to about 400 degrees Celsius. The vapor pressure is about 0.2 torr at 70 degrees Celsius. The oxidant gas may contain $H_2O$, $(H_2+O_2)$, or $O_3$. As a result, aluminum oxide is formed as the material for the etching stop layer 100. The dielectric constant value of the etching stop layer 100 is about 8.2, its associated leakage current is less than about $1 \times 10^{-12}$ amps, and its associated electric breakdown strength (EBD) is about 8.2 millivolts per centimeter.

As is illustrated in FIG. 2, the etching stop layer 100 is formed to have a relatively co-planar surface (i.e., within a few angstroms or less) with the conductive elements 80. This may be accomplished in one of two ways. In one embodiment, the polishing process 90 (shown in FIG. 1) may be configured such that the dielectric material 70 has a lower upper surface than the conductive elements 80. In other words, the dielectric material 70 may be "over-polished" to form "recesses". The etching stop layer 100 may then be formed to fill these "recesses" by the SALD process 110 so as to be relatively co-planar with the conductive elements 80. In another embodiment, the dielectric material 70 is removed in an etching process to form the "recesses", which are then filled by the etching stop layer 100 by the SALD process 110.

The etching stop layer 100 is formed to have a thickness 120. In some embodiments, the thickness 120 is in a range from about 2 nanometers to about 5 nanometers. The thickness range is selected because if it is too thin, then the etching stop layer 100 may not be able to adequately serve the etching stop function in a later process (discussed below in more detail). On the other hand, if the thickness 120 is too thick, the selective growth (i.e., growing on the surface of the dielectric material 70 but not on the surface of the conductive elements 80) may be difficult to control, and it is possible that some portions of the etching stop layer 100 may "spill over" to the surfaces of the conductive elements 80. Thus, the thickness range of 2-5 nanometers represents an optimum thickness range for the etching stop layer 100.

Figure 3:
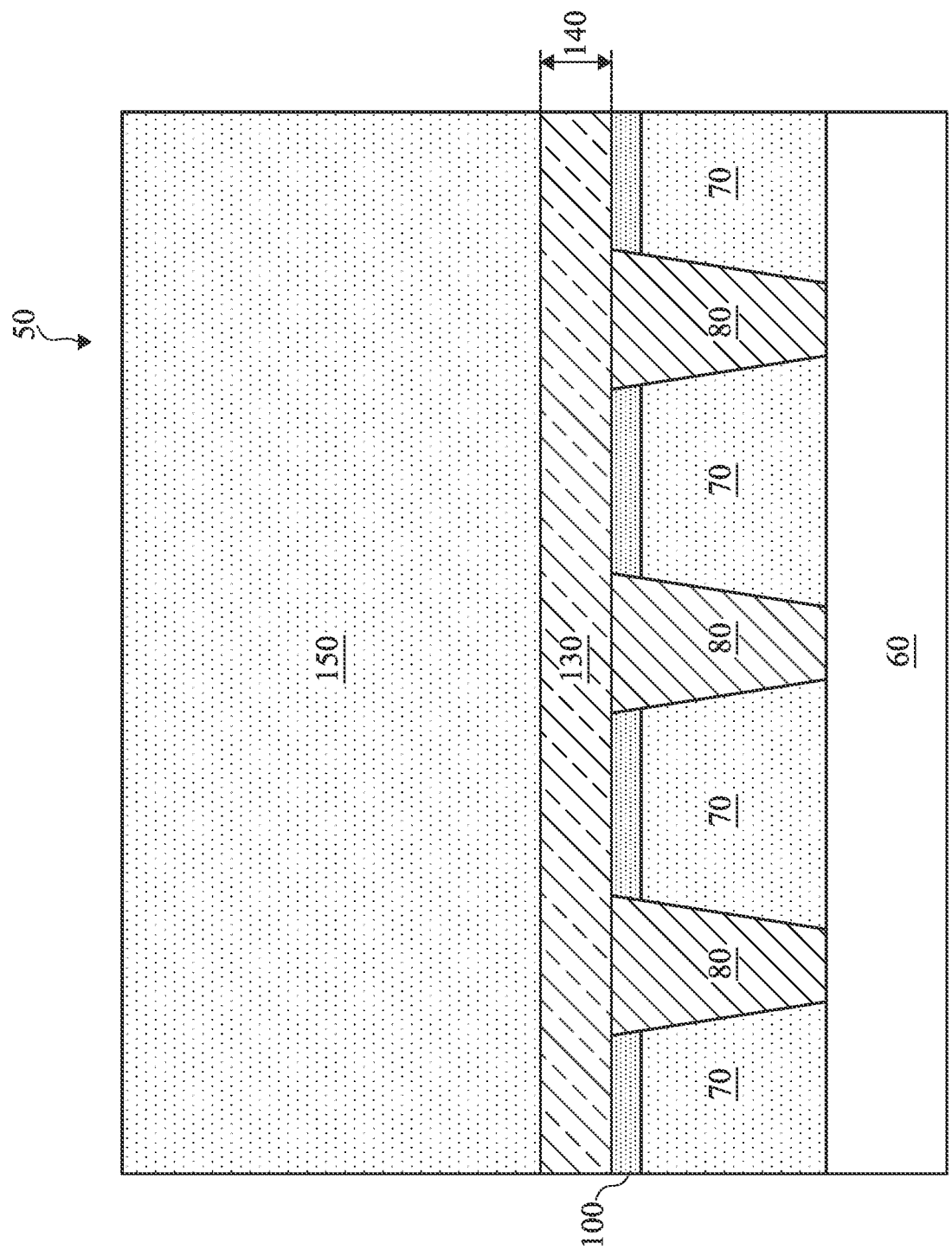

Referring now to FIG. 3, another etching stop layer 130 is formed over the etching stop layer 100 and over the conductive elements 80. The etching stop layer 130 has a different material composition than the etching stop layer 100. The etching stop layer 130 may be formed by a chemical vapor deposition (CVD) process. In some embodiments, the etching stop layer 130 contains silicon oxycarbide (SiOC) or silicon oxynitride (SiON). The etching stop layer 130 also is formed with a thickness 140. The thickness 140 is in a range from about 2 nanometers to about 8 nanometers in some embodiments. In some embodiments, the thickness 140 is in a range from about 30 nanometers to about 60 nanometers. The thickness 140 is tuned so that the etching stop layer 130 can adequately serve its purpose as an etching-stop layer in a later etching process discussed below.

Still referring to FIG. 3, a dielectric material 150 is formed over the etching stop layer 130. The dielectric material 150 may have a similar material composition to the dielectric material 70. For example, the dielectric material 150 may also contain a low-k dielectric material discussed above. Both the dielectric material 70 and the dielectric material 150 may also be referred to as interlayer dielectric (ILD) of an interconnect structure.

Figure 4:
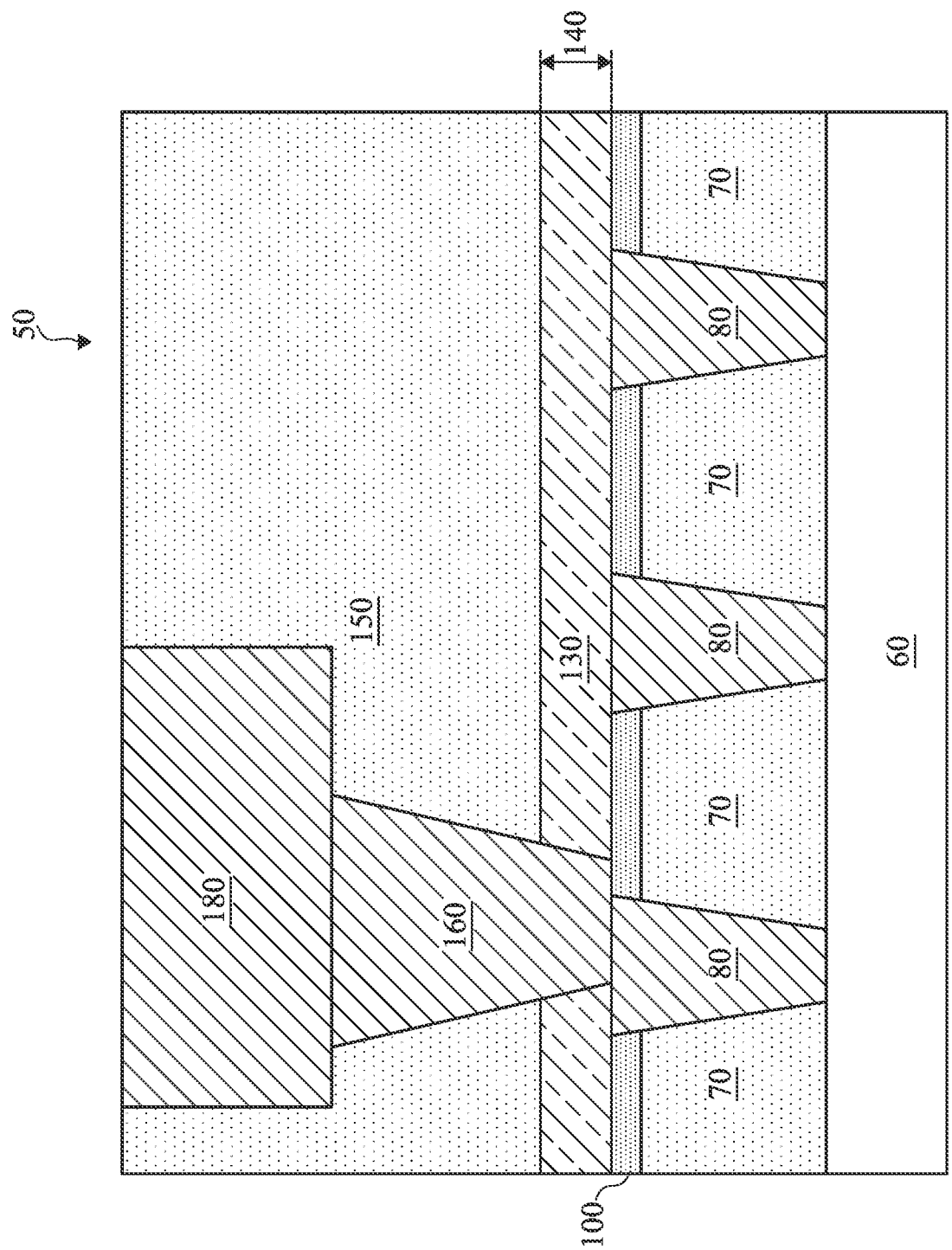

Referring now to FIG. 4, a via 160 and a conductive element 180 are formed in the dielectric material 150. The conductive element 180 is also referred to as a metal line of a $M_{X+1}$ interconnect layer of the multilayered interconnect structure (the via 160 may or may not be considered to be a part of the $M_{X+1}$ interconnect layer). As is shown in FIG. 4, the conductive element 180 is formed above (and comes into direct physical contact with) the via 160. The via 160 is at least partially aligned with the conductive element 80. As is shown in FIG. 4, the via 160 is formed to extend through the etching stop layer 130 and comes into direct physical contact with one of the conductive element 80. In this manner, the via 160 electrically interconnects together the conductive elements 80 and 180. Stated differently, the via 160 electrically interconnects together the metal lines of the $M_X$ interconnect layer and the $M_{X+1}$ interconnect layer.

In some embodiments, the via 160 and the conductive element 180 are formed using a dual damascene process. In other embodiments, the via 160 and the conductive element 180 are formed using a single damascene process. Regardless, the damascene process used to form the via 160 includes etching processes. For example, in a first etching process, a recess or opening is etched in the dielectric material 150, while the etching stop layer 130 serves as an etching stop layer herein to prevent the layers therebelow from being etched. C4F8, CF4, N2, Ar may be used as etchants. Thereafter, the etching stop layer 130 itself is "opened" in another etching process so as to extent the recess or opening down to the conductive element 80. C4F8, C4F6, CF4, or N2 may be used as etchants.

Conventionally, the etching stop layer 100 is not formed. Consequently, the etching process for opening the etching stop layer 130 may inadvertently "punch through" the etching stop layer 130 and cause portions of the dielectric material 70 therebelow to also be etched. Thereafter, when the etched recess or opening is filled with a conductive material to form the via 160, a portion of the via 160 would extend into the dielectric material 70, resembling a "tiger tooth." This tiger tooth effect is exacerbated as the misalignment between the via 160 and the conductive element 80 worsens. As a result, device performance such as reliability (e.g., measured by time-dependent dielectric breakdown, or TDDB) may suffer, and/or excessive contact resistance problems may arise from gap fill void.

The present disclosure prevents the over-etching of the dielectric material 70 by forming the etching stop layer 100. The material composition of the etching stop layer 100 is configured to have a high etching selectivity (e.g., greater than 1:100) with respect to the etching stop layer 130 during the etching process to "open" the etching stop layer 130. In this manner, while the etching stop layer 130 is "opened", little to no portion of the etching stop layer 100 is removed. Hence, even if there is misalignment between the via 160 and the conductive element 80, no portion of the via 160 would punch through the dielectric material 70 (because it is stopped by the etching stop layer 100) to form the "tiger tooth" discussed above. Stated differently, the portion of the via 160 that is offset from the conductive element 80 is formed on the etching stop layer 100 according to the present disclosure.

Since the "tiger tooth" via punch through is no longer a problem, the process windows for forming the via 160 can be relaxed, and the device performance may be improved as well. For example, since misalignment will likely not lead to the "tiger tooth"-like via punch through, the via 160 can be made to be bigger (e.g., wider lateral dimension) to ensure that there is physical contact between the via 160 and the conductive element 80. The greater via size may reduce contact resistance, in addition to relaxing gap filling windows in the damascene process.

FIGS. 5-9 are diagrammatic fragmentary cross-sectional side views of the semiconductor device 50 at various stages of fabrication in accordance with another embodiment of the present disclosure. For reasons of clarity and consistency, similar elements appearing in FIGS. 1-9 are labeled the same, and the details of these elements are not necessarily repeated again below.

Figure 5:
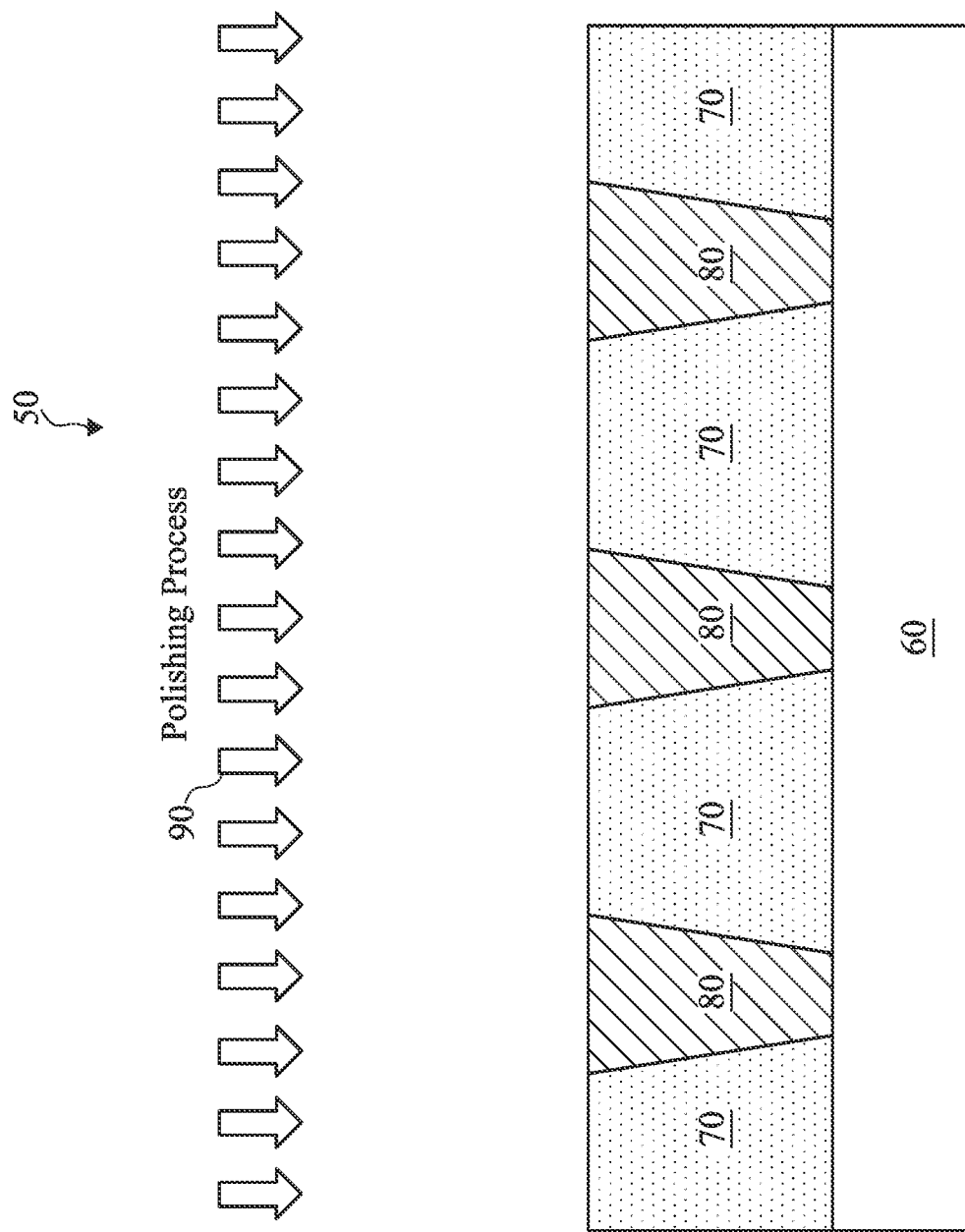

Referring to FIG. 5, a substrate 60 is provided. A $M_X$ interconnect layer including the dielectric material 70 and the conductive elements 80 is formed over the substrate 60. A polishing process 90 is performed to planarize the surface of the $M_X$ interconnect layer.

Figure 6:
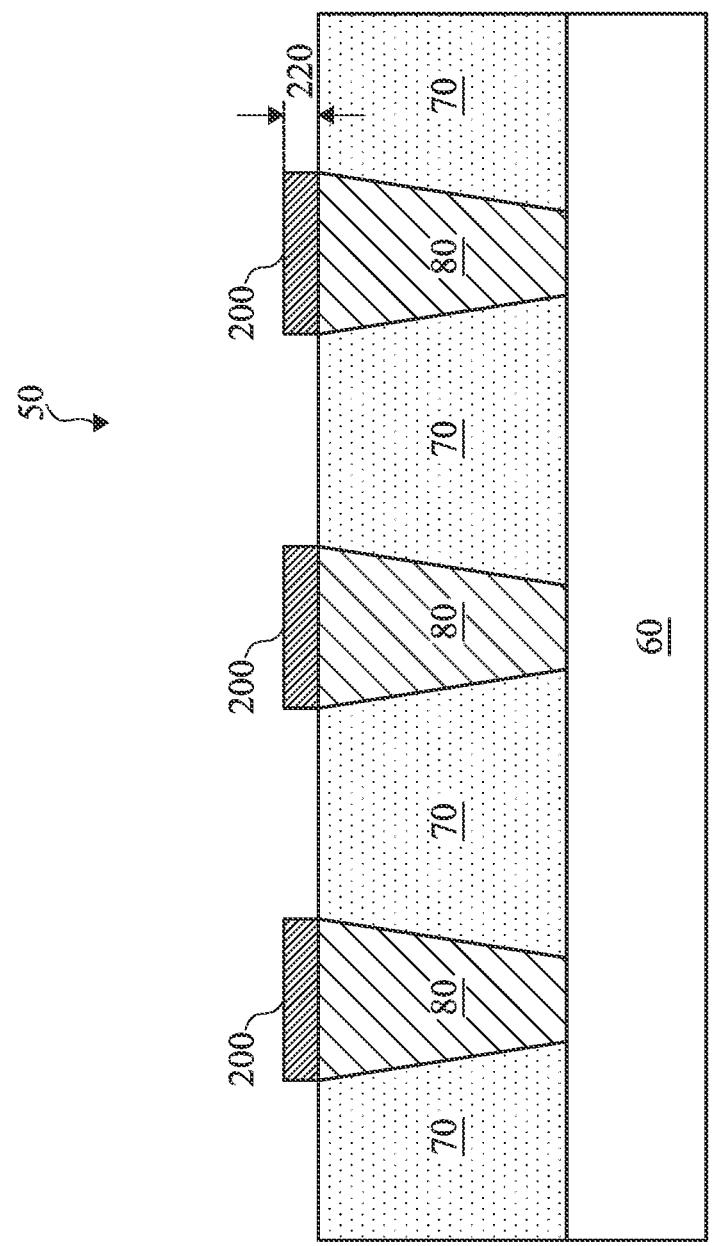

Referring now to FIG. 6, a plurality of metal capping layers 200 is formed. Each metal capping layer 200 is formed on the upper surface of a respective conductive element 80, but not on the surface of the dielectric material 70. In some embodiments, the metal capping layer 200 is formed by a selective CVD process. The metal capping layer 200 contains cobalt in the present embodiment but may contain other suitable metal materials in alternative embodiments. The metal capping layer 200 is formed to have a thickness 220. In some embodiments, the thickness 220 is in a range from about 2 nanometers to about 5 nanometers.

Figure 7:
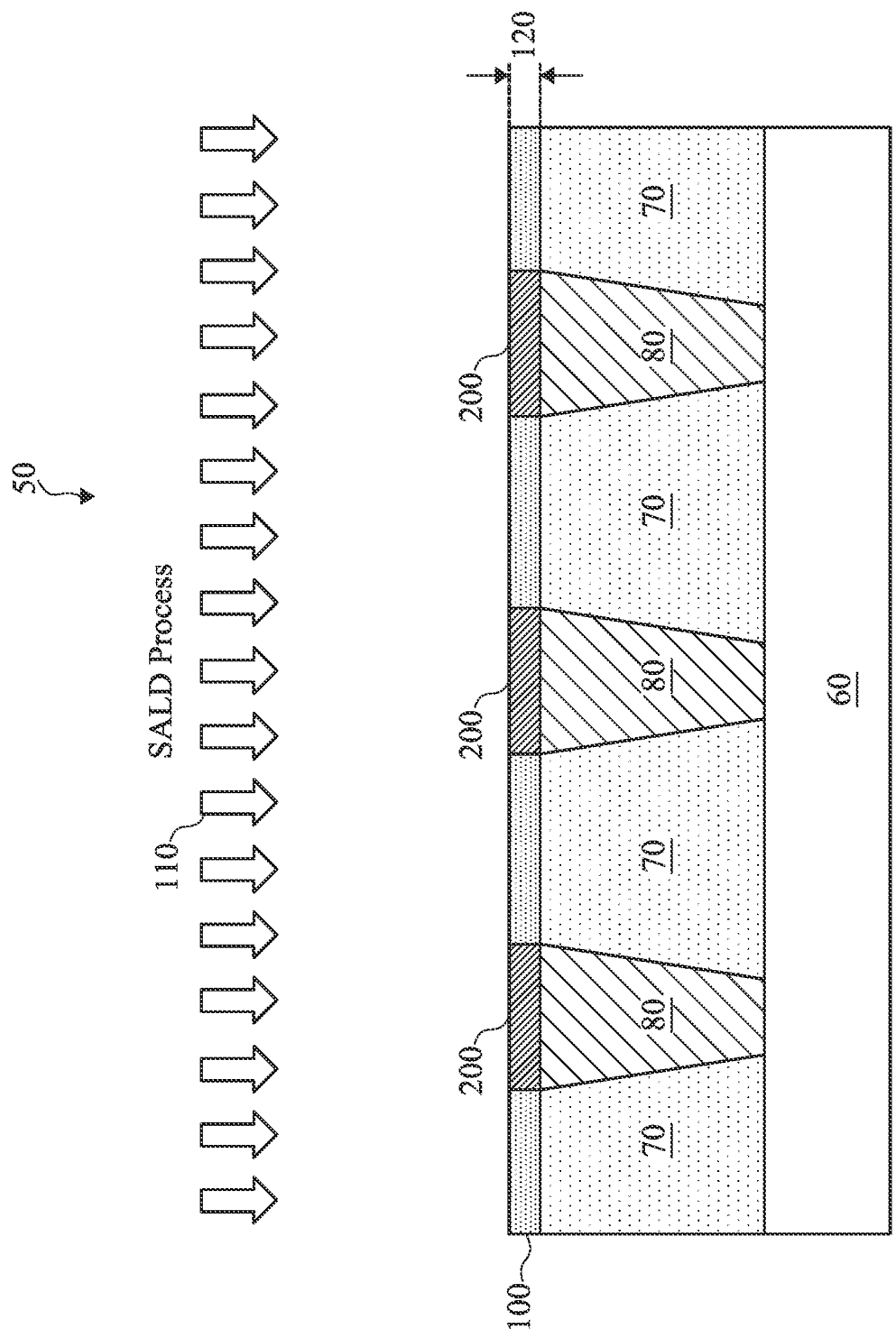

Referring now to FIG. 7, an etching stop layer 100 is formed via an SALD process 110. The details of the SALD process 110 are the same as that discussed above with reference to FIG. 2 and will not be repeated herein for reasons of simplicity. The SALD process 110 forms the etching stop layer 100 (containing a metal oxide material) on the surfaces of the dielectric material 70 but not on the surfaces of the metal capping layer 200. The etching stop layer 100 is also formed to have a thickness 120, which is about the same as the thickness 220 of the metal capping layer 200. In other words, the thickness 120 of the etching stop layer 100 is also in a range from about 2 nanometers to about 5 nanometers. As discussed above, the value of the thickness 120 is optimally configured so as to be not too thin or too thick, since the layer 100 may not adequately serve the etching stop function if it is formed too thin, and its selectively growth (not to be formed on the metal capping layer 200) may be too difficult to control if it is formed too thick.

Figure 8:
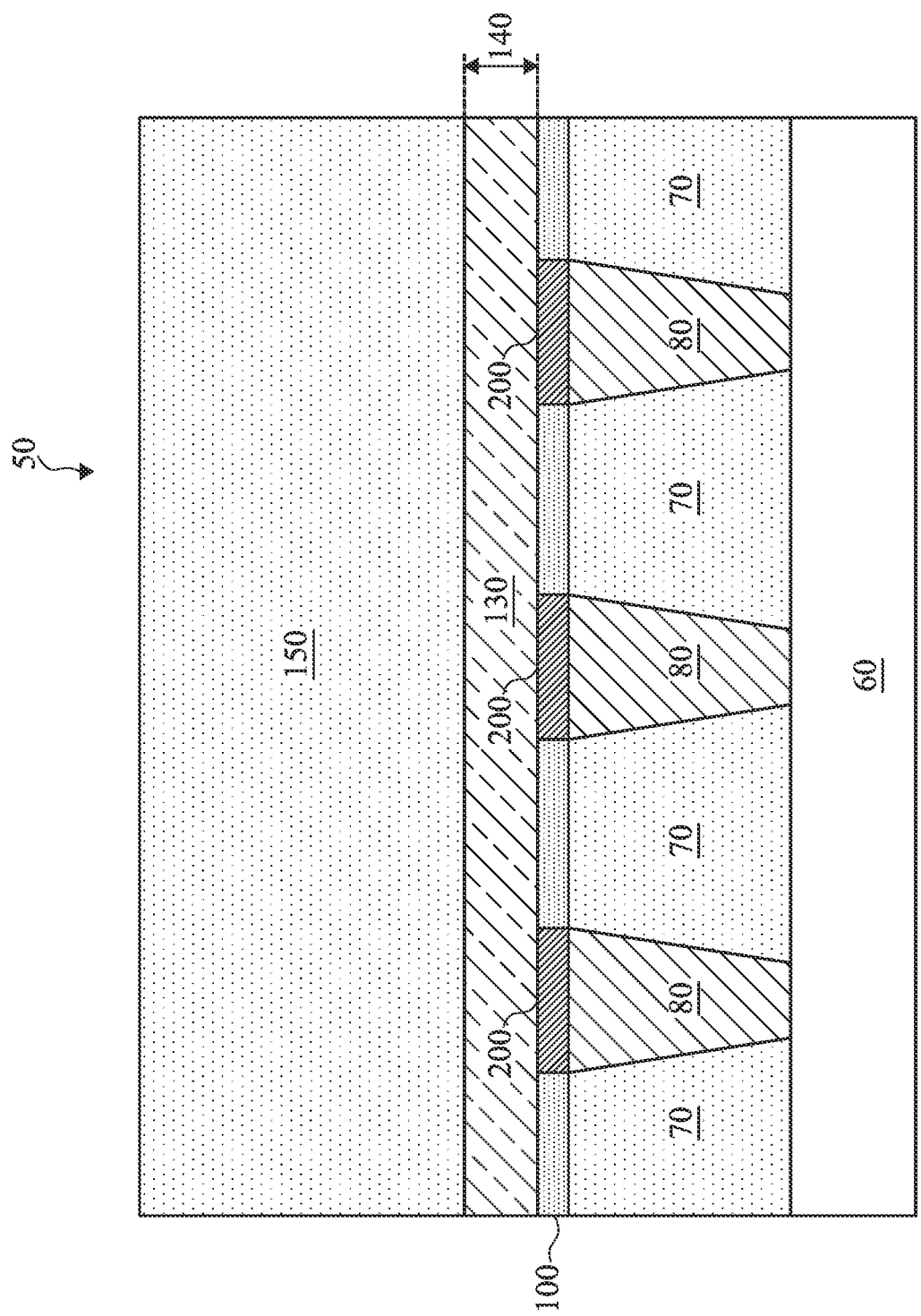

Referring now to FIG. 8, another etching stop layer 130 is formed over the etching stop layer 100 and over the metal capping layers 200. Again, the etching stop layer 130 has a different material composition than the etching stop layer 100. For example, the etching stop layer 130 may contain silicon oxycarbide (SiOC) or silicon oxynitride (SiON), while the etching stop layer 100 may contain hafnium oxide, zirconium oxide, or aluminum oxide. The etching stop layer 130 also is formed to be in a range from about 2 nanometers to about 8 nanometers. In some embodiments, a thickness 140 of the etching stop layer 130 is in a range from about 30 nanometers to about 60 nanometers, which allows the etching stop layer 200 to adequately serve its purpose as an etching-stop layer in a later etching process discussed below. As is shown in FIG. 8, a dielectric material 150 is also formed over the etching stop layer 130.

Figure 9:
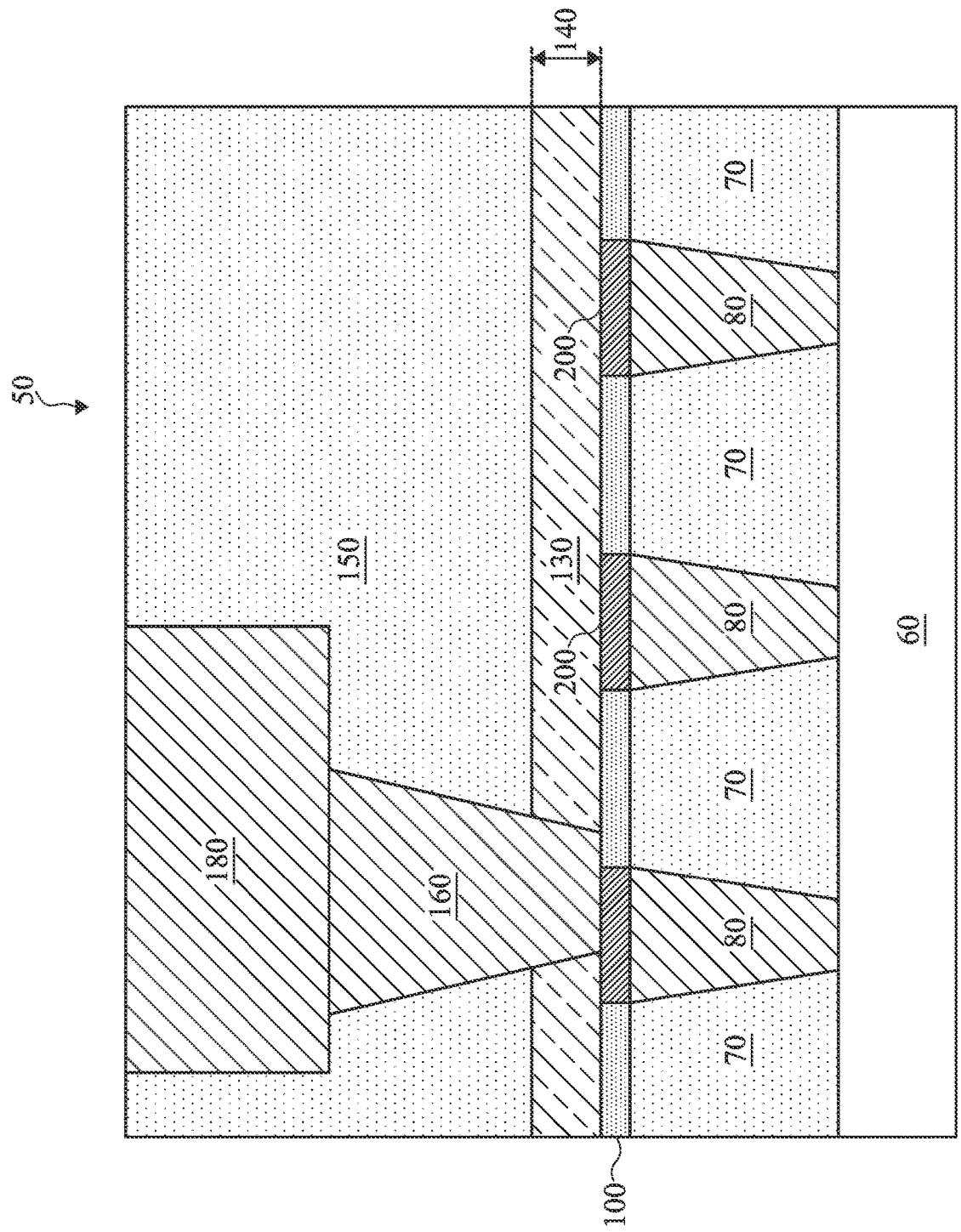

Referring now to FIG. 9, a via 160 and a conductive element 180 (of a $M_{X+1}$ interconnect layer) are formed in the dielectric material 150. The via 160 is at least partially aligned with the conductive element 80. The via 160 is also formed to extend through the etching stop layer 130 and comes into direct physical contact with one of the metal capping layers 200. Since the metal capping layer 200 is electrically conductive, the via 160 still electrically interconnects together the conductive elements 80 and 180. And regardless of how the via 160 is formed, the etching process used to form it by "opening" the etching stop layer 130 will be stopped by the etching stop layer 100. In other words, the dielectric material 70 will not be inadvertently "punched through" by the formation of the via 160. Thus, for reasons similar to those discussed above with reference to FIG. 4, the embodiment shown in FIG. 9 also avoids the "tiger tooth" problems and can offer better gap filling performance, relaxed process windows, and improved device performance.

FIGS. 10-14 are diagrammatic fragmentary cross-sectional side views of the semiconductor device 50 at various stages of fabrication in accordance with yet another embodiment of the present disclosure. For reasons of clarity and consistency, similar elements appearing in FIGS. 1-15 are labeled the same, and the details of these elements are not necessarily repeated again below.

Figure 10:
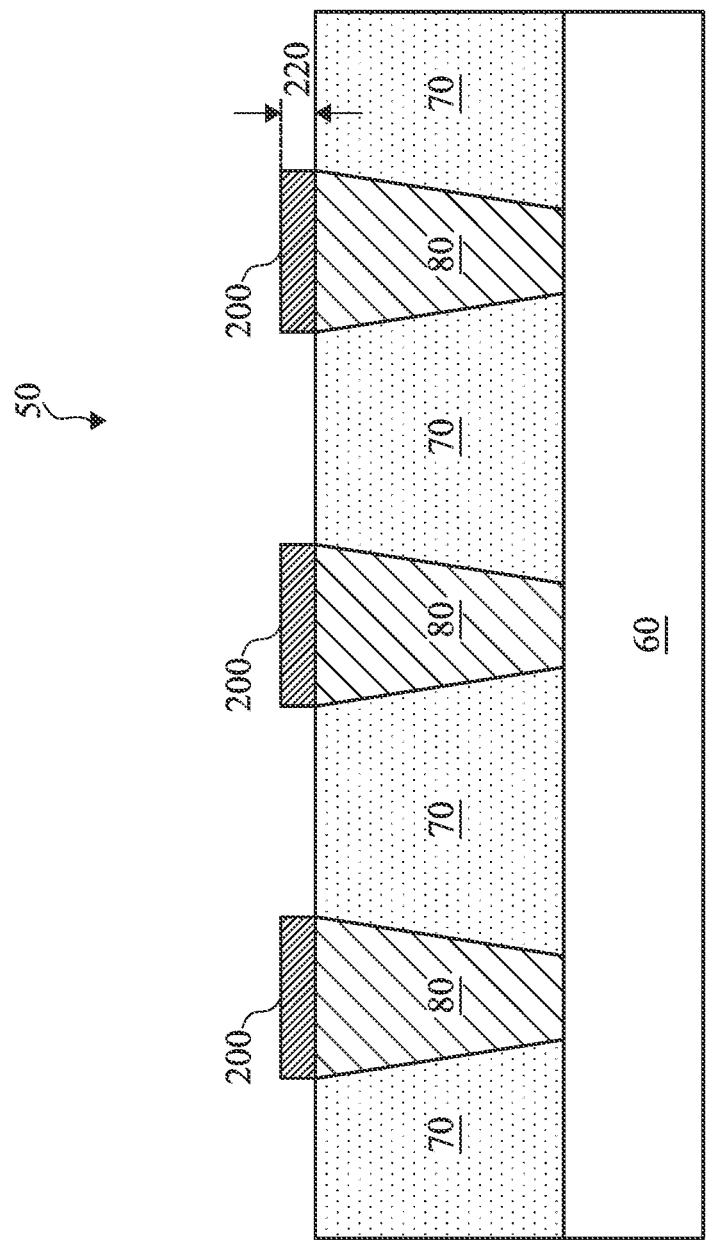

Referring to FIG. 10, a substrate 60 is provided. A $M_X$ interconnect layer including the dielectric material 70 and the conductive elements 80 are formed over the substrate 60. A polishing process is performed to planarize the surface of the $M_X$ interconnect layer. A plurality of metal capping layers 200 is formed (for example by a selective CVD process) on the upper surfaces of the conductive element 80, but not on the surface of the dielectric material 70. The metal capping layer 200 is formed to have a thickness 220, which may be in a range from about 2 nanometers to about 5 nanometers.

Figure 11:
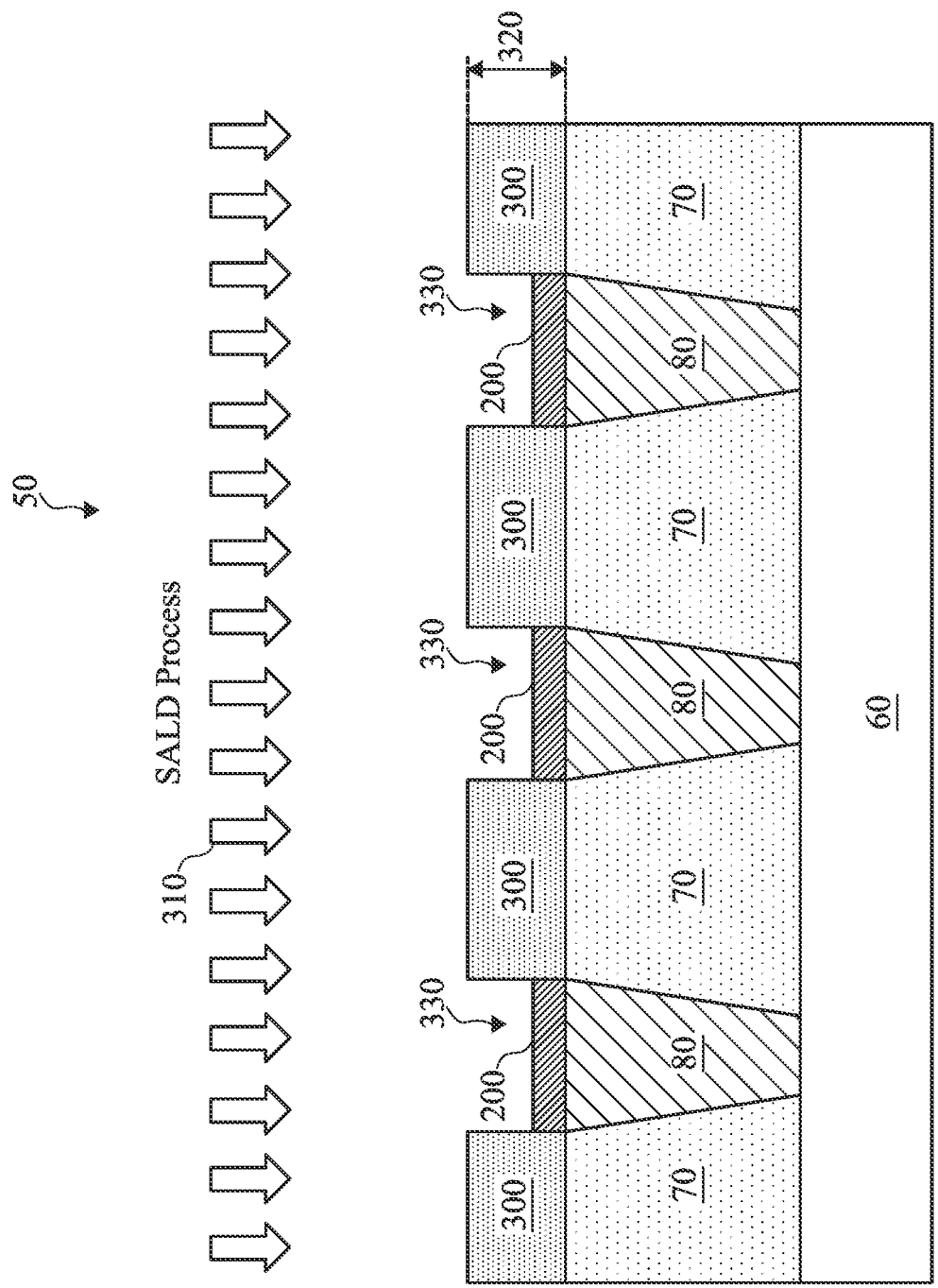

Referring now to FIG. 11, an etching stop layer 300 is formed via an SALD process 310. The details of the SALD process 310 are similar to the SALD process 110 discussed above with reference to FIG. 2. However, additional cycles may be performed to increase the thickness of the etching stop layer 300. In other words, the etching stop layer 300 (containing a metal oxide material) is still formed on the surfaces of the dielectric material 70 but not on the surfaces of the metal capping layer 200, but the etching stop layer 300 has a thickness 320, which is thicker than the thickness 220 of the metal capping layer 200. In some embodiments, the thickness 320 of the etching stop layer 300 is a range from about 6 nanometers to about 10 nanometers. Due to the increased thickness 300, recesses 330 are formed by the etching stop layer 300 and the metal capping layers 200.

Figure 12:
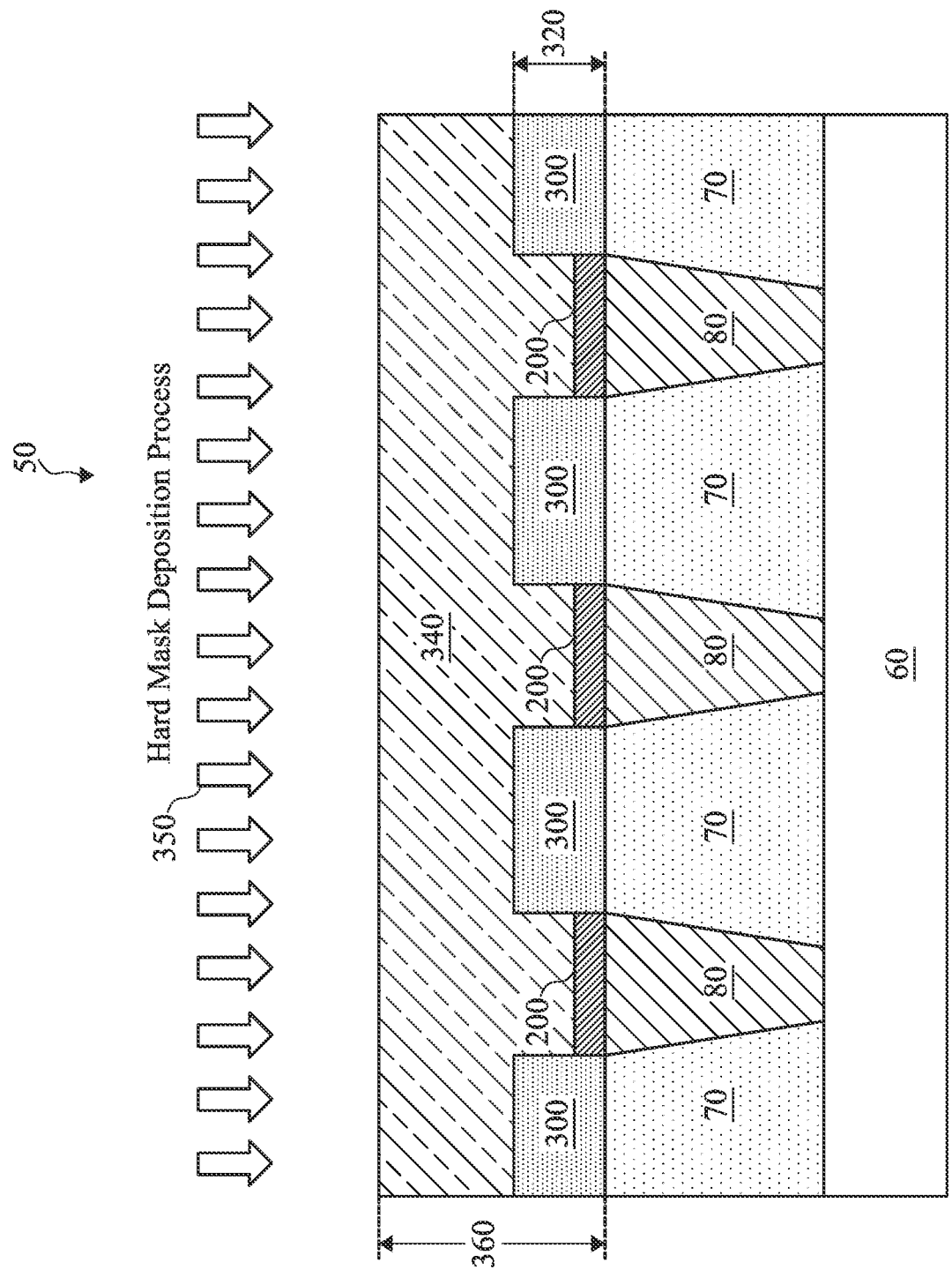

Referring now to FIG. 12, a hard mask layer 340 is formed over the etching stop layer 300 and over the metal capping layers 200, thereby filling the recesses 330. The hard mask layer 340 is formed by a hard mask deposition process 350. In some embodiments, the hard mask deposition process 350 includes a spin-on dielectric process with the following process conditions:

Sol-gel: ethanol/siloxane oligomers
Rotation speed: 1000-4000 revolutions per minute (RPM)

Baking temperature: 80 degrees Celsius-350 degrees Celsius

Ultraviolet (UV) curing: 350 degrees Celsius-400 degrees Celsius, for about 60-120 seconds The hard mask layer 340 has a different material composition than the etching stop layer 300. For example, the hard mask layer 340 may contain silicon oxide, while the etching stop layer 300 may contain hafnium oxide, zirconium oxide, or aluminum oxide. The hard mask layer 340 also is formed to be at least several times thicker than the etching stop layer 300. In some embodiments, a thickness 360 of the hard mask layer 340 is in a range from about 20 nanometers to about 40 nanometers.

Figure 13:
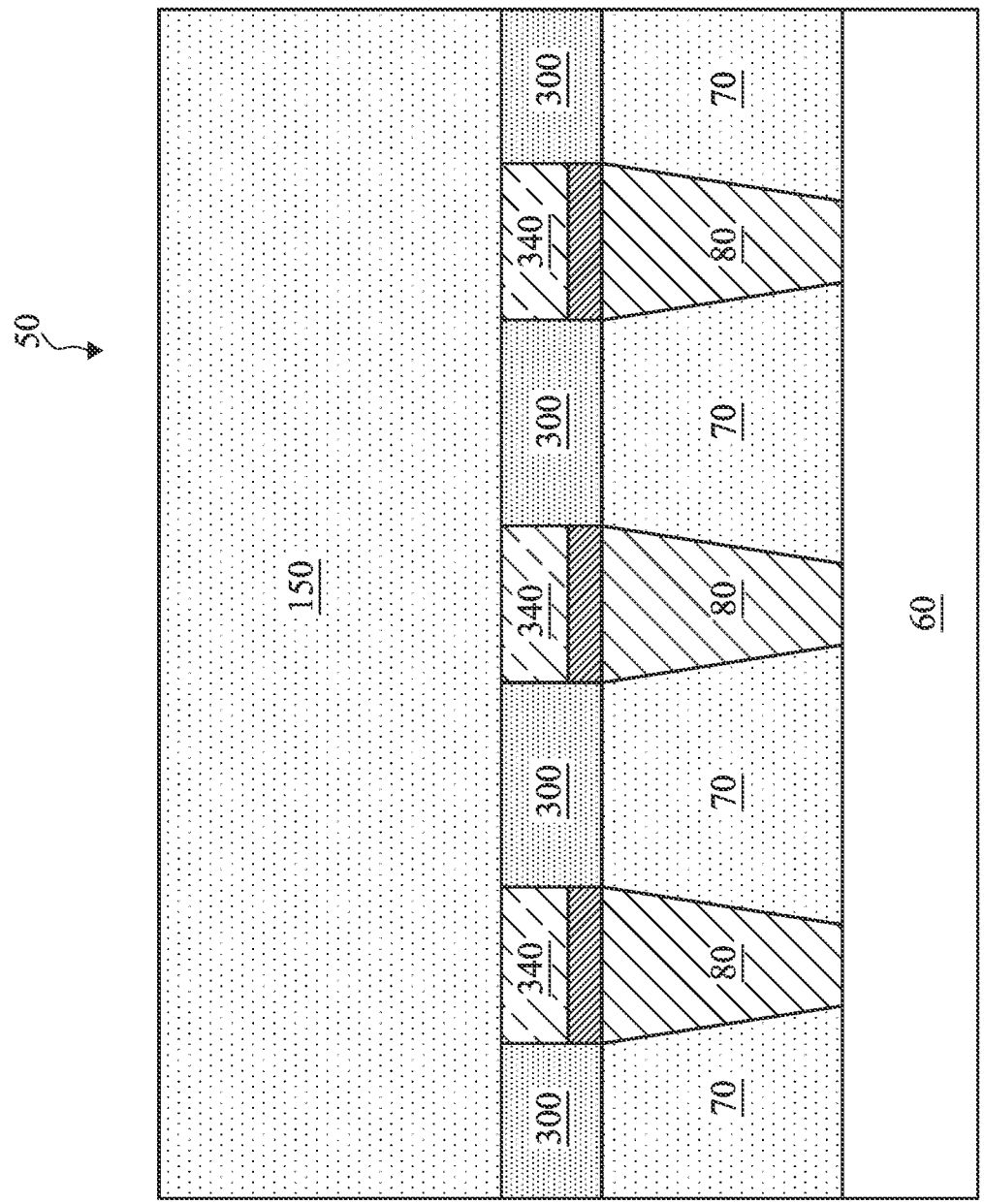

Referring now to FIG. 13, a polishing process (such as a chemical mechanical polishing process) is performed to etch away portions of the hard mask layer 340 until it has a coplanar surface with the etching stop layers 300. Thereafter, a dielectric material 150 is formed on the surfaces of the hard mask layer 340 and on the etching stop layer 300.

Figure 14:
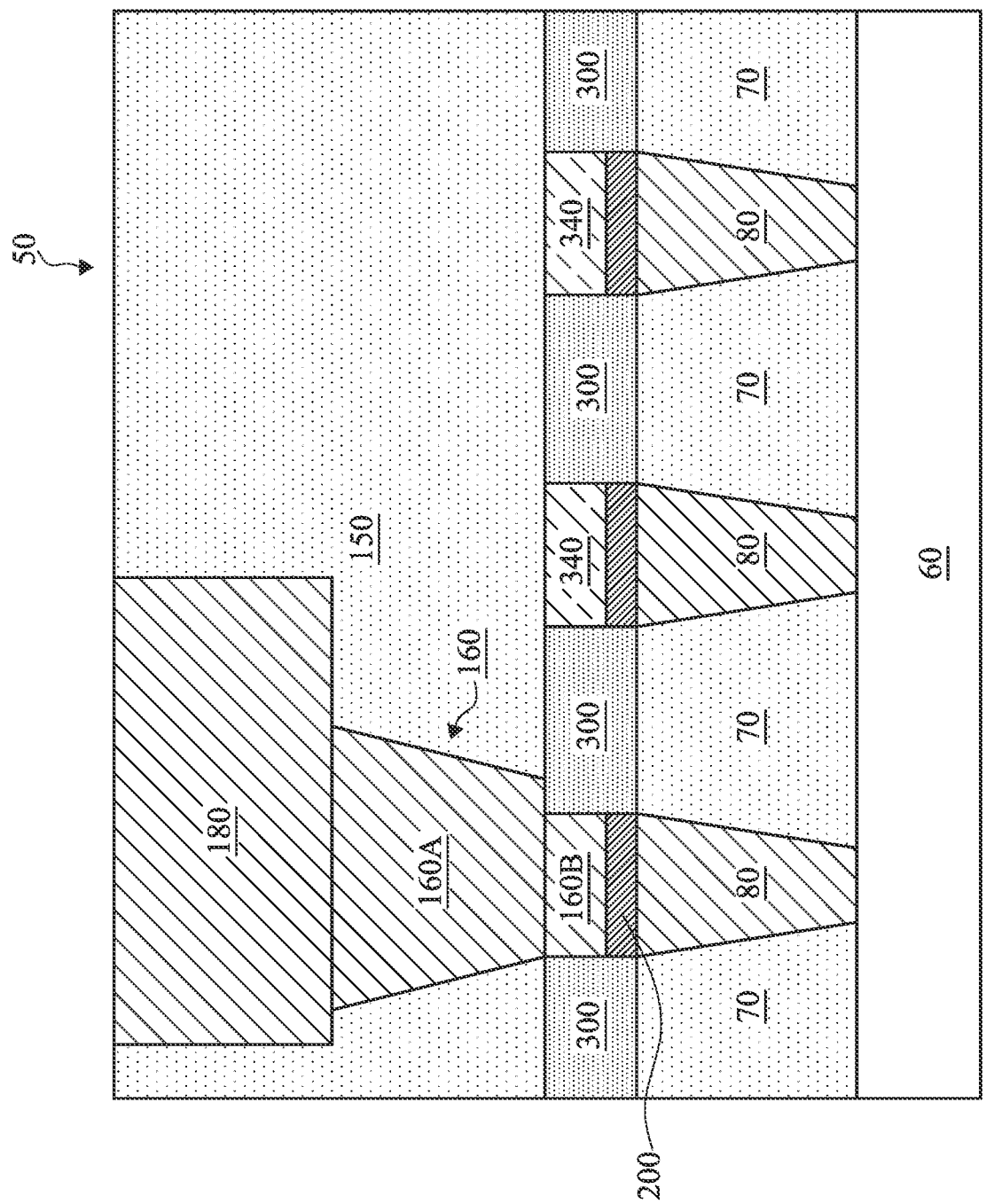

Referring now to FIG. 14, a via 160 and a conductive element 180 (of a $M_{X+1}$ interconnect layer) are formed in the dielectric material 150. The via 160 is formed by performing an etching process to etch an opening in the dielectric material 150, while the hard mask 340 (and also the etching stop layer 300) serves as an etching stop layer. The hard mask 340 is thereafter "opened" in another etching process, while the etching stop layer 300 serves as the etching stop layer to prevent the dielectric layer 70 from being inadvertently over-etched, due to a high etching selectivity (e.g., >100:1) between the hard mask layer 340 and the etching stop layer 300. Alternatively, a single etching process may be performed to etch both the dielectric material 150 and the portion of the hard mask disposed over the conductive element 80. As long as there is sufficient etching selectivity between the etching stop layer 300 and the hard mask layer 340/the dielectric layer 150, the etching stop layer 300 can prevent etching of the dielectric material 70 below.

Thus, after the etched opening is filled, the portion of the hard mask layer 340 disposed above one of the conductive elements 80 is effectively replaced by a segment 160B of the via 160, whereas another segment 160A of the via 160 is disposed in the dielectric material 150. And since the metal capping layer 200 is electrically conductive, the via 160 still electrically interconnects together the conductive elements 80 and 180. In this manner, even though the steps are different, this embodiment shown in FIGS. 10-14 still avoids the "tiger tooth" problems and can offer better gap filling performance, relaxed process windows, and better device performance.

Figure 15:
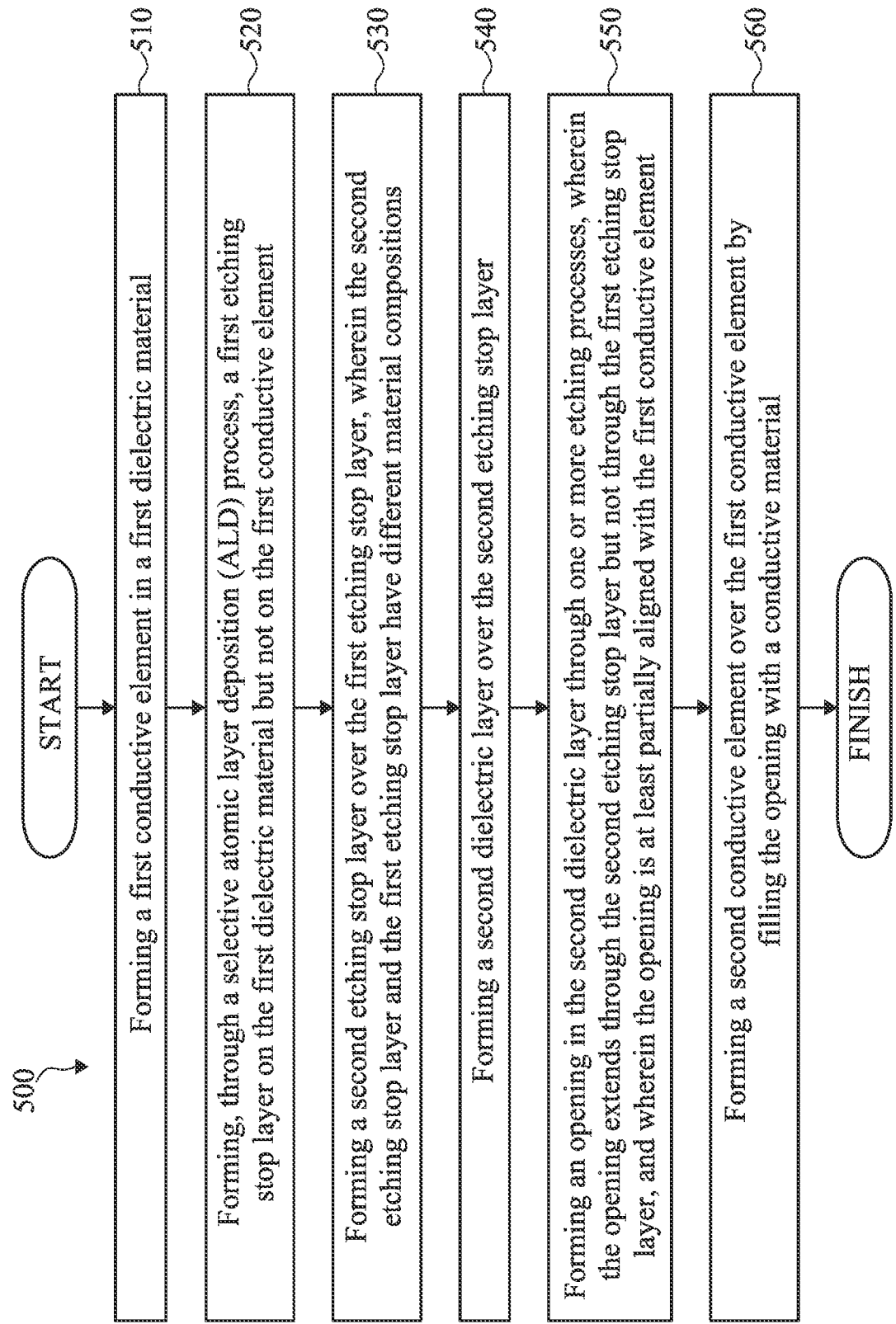
FIG. 15 is a flowchart illustrating a method of fabricating a semiconductor device in accordance with some embodiments of the present disclosure.

FIG. 15 is a flowchart of a method 500 of fabricating a semiconductor device according to various aspects of the present disclosure. One or more of the steps of the method 500 are performed as a part of a fabrication process for a semiconductor technology node that is a 5-nanometer technology node or smaller.

The method 500 includes a step 510 of forming a first conductive element in a first dielectric material.

The method 500 includes a step 520 of forming, through a selective atomic layer deposition (ALD) process, a first etching stop layer on the first dielectric material but not on the first conductive element.

The method 500 includes a step 530 of forming a second etching stop layer over the first etching stop layer. The second etching stop layer and the first etching stop layer have different material compositions. In some embodiments, the second etching stop layer is formed to be in a range from about 2 nanometers to about 8 nanometers. For example, the second etching stop layer may be 5-10 times thicker than the first etching stop layer. In some embodiments, the material compositions of the first and second etching stop layer are configured such that the first and second etching stop layers have substantially different etching rates. In other words, a high etching selectivity (e.g., greater than 100:1) exists between them. In some embodiments, the first etching stop layer is formed to contain hafnium oxide, zirconium oxide, or aluminum oxide. In some embodiments, the second etching stop layer is formed to contain silicon oxycarbide (SiOC) or silicon oxynitride (SiON).

The method 500 includes a step 540 of forming a second dielectric layer over the second etching stop layer. In some embodiments, both the first dielectric layer and the second dielectric layer contain a low-k dielectric material.

The method 500 includes a step 550 of forming an opening in the second dielectric layer through one or more etching processes, wherein the opening extends through the second etching stop layer but not through the first etching stop layer, and wherein the opening is at least partially aligned with the first conductive element.

The method 500 includes a step 560 of forming a second conductive element over the first conductive element by filling the opening.

It is understood that additional processes may be performed before, during, or after the steps 510-560 of the method 500 to complete the fabrication of the semiconductor device. For example, a third conductive element is over the second conductive element. The first conductive element is a first metal line of a $M_X$ interconnect layer of an interconnect structure. The third conductive element is a second metal line of a $M_{X+1}$ interconnect layer of the interconnect structure. The second conductive element is a via that interconnects the first and third conductive elements together. For reasons of simplicity, additional fabrication steps are not discussed herein in detail.

Based on the above discussions, it can be seen that the present disclosure offers advantages over conventional methods and devices of forming vias. It is understood, however, that other embodiments may offer additional advantages, and not all advantages are necessarily disclosed herein, and that no particular advantage is required for all embodiments. One advantage is that, as discussed above, by forming an extra etching stop layer, the present disclosure can prevent inadvertent over-etching of the ILD layer. As such, the overlay or alignment requirements for the via are relaxed. The via can be made larger, which allows for better gap filling performance as well as reducing a contact resistance. Other advantages are that the present disclosure does not require many changes to the existing method of fabrication. As such, it does not significantly increase fabrication cost, if at all.

One aspect of the present disclosure pertains to a semiconductor device. The semiconductor device includes a first layer of an interconnect structure formed over a substrate. The first layer contains a first dielectric material and a first conductive element disposed in the first dielectric material. The semiconductor device includes a first etching stop layer that is disposed on the first dielectric material of the first layer but not on the first conductive element of the first layer. The semiconductor device includes a second conductive element disposed over the first layer. The second conductive element is at least partially aligned with, and electrically coupled to, the first conductive element.

Another aspect of the present disclosure pertains to a semiconductor device. The semiconductor device includes a $M_X$ interconnect layer of an interconnect structure disposed over a substrate. The $M_X$ interconnect layer contains a first dielectric material and a plurality of first metal lines disposed in the first dielectric material. The semiconductor device includes a first etching stop layer that is disposed on the first dielectric material but not on the first metal lines. The first etching stop layer contains hafnium oxide, zirconium oxide, or aluminum oxide. The semiconductor device includes a second etching stop layer disposed over the first etching stop layer, wherein the second etching stop layer contains silicon oxycarbide (SiOC) or silicon oxynitride (SiON). The semiconductor device includes a $M_{X+1}$ interconnect layer of the interconnect structure disposed over the $M_X$ interconnect layer. The $M_{X+1}$ interconnect layer contains a second dielectric material and a second metal line disposed in the second dielectric material. The semiconductor device includes a via that electrically interconnects at least one of the first metal lines with the second metal line. The via extends through the second etching stop layer but not the first etching stop layer.

Yet another aspect of the present disclosure pertains to a method of fabricating a semiconductor device. A first conductive element is formed in a first dielectric material. Through a selective atomic layer deposition (ALD) process, a first etching stop layer is formed on the first dielectric material but not on the first conductive element. A second conductive element is formed over the first conductive element. The second conductive element is formed to be at least partially aligned with, and electrically coupled to, the first conductive element.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
    planarizing upper surfaces of a first interconnect layer that includes a plurality of first conductive elements embedded in a first dielectric layer;
    selectively forming a metal capping layer on the first conductive elements, wherein the metal capping layer protrudes vertically above the first dielectric layer;
    after the metal capping layer has been formed, selectively depositing a first etching stop layer over the first dielectric layer; and
    depositing a second etching stop layer over the first etching stop layer and over the metal capping layer.

2. The method of claim 1, wherein the selectively depositing the first etching stop layer is performed using a selective atomic layer deposition (SALD) process that includes turning on a precursor gas and turning on an oxidant gas in alternating cycles.

3. The method of claim 2, wherein the turning on the precursor gas includes turning on Tetrakisethylmethylaminohafnium (TEMAHY) as the precursor gas.

4. The method of claim 2, wherein the turning on the precursor gas includes turning on tetrakis(ethylmethylamido)zirconium (TEMA-Zr) as the precursor gas.

5. The method of claim 2, wherein the turning on the precursor gas includes turning on Tetrakis(dimethylamido) Aluminum (TDMAA) as the precursor gas.

6. The method of claim 2, wherein the turning on the precursor gas includes turning on Trimethyl Aluminum (TMA) as the precursor gas.

7. The method of claim 2, wherein the turning on the oxidant gas includes turning on $H_2O$, $(H_2+O_2)$, or $O_3$ as the oxidant gas.

8. The method of claim 1, wherein the selectively depositing the first etching stop layer comprises depositing the first etching stop layer until the first etching stop layer and the metal capping layer have substantially co-planar upper surfaces.

9. The method of claim 1, further comprising:
    forming a second dielectric layer over the second etching stop layer; and
    forming one or more conductive elements that extend vertically through the second dielectric layer, wherein the one or more conductive elements are electrically coupled to at least a component of the metal capping layer.

10. A method, comprising:
    providing a first interconnect layer that includes a first dielectric layer and a first metal line formed in the first dielectric layer;
    forming a metal capping layer on upper surfaces of the first metal line but not on upper surfaces of the first dielectric layer;
    after the metal capping layer has been formed, forming, using a selective atomic layer deposition (SALD) process, a metal oxide layer over upper surfaces of the first dielectric layer, wherein the SALD process is performed using a plurality of cycles in which a precursor gas and an oxidant gas are turned on alternatingly;
    forming a silicon-containing layer over the metal oxide layer and over the metal capping layer, wherein the silicon-containing layer and the metal oxide layer have different material compositions;
    forming a second dielectric layer over the silicon-containing layer; and
    forming a via and a second metal line in the second dielectric layer, wherein the via is formed such that an upper surface of the via is in contact with the second metal line, and a lower surface of the via is in contact with the metal capping layer.

11. The method of claim 10, wherein the forming the silicon-containing layer comprises depositing a silicon oxycarbide layer or a silicon oxynitride layer as the silicon-containing layer.

12. The method of claim 10, wherein the forming the via and the second metal line comprises performing one or more etching processes, and wherein the metal oxide layer and the silicon-containing layer have different etching rates during the one or more etching processes.

13. A method, comprising:
    polishing upper surfaces of a first interconnect layer that includes a first dielectric layer and a first conductive layer;
    forming a metal capping layer over the first conductive layer but not over the first dielectric layer;
    after the metal capping layer has been formed, forming a first etching stop layer over the first dielectric layer but not over the first conductive layer;

forming a second etching stop layer over the first etching stop layer, wherein the second etching stop layer and the first etching stop layer have different material compositions; and forming a second interconnect layer over the second etching stop layer.

14. The method of claim 13, wherein the first etching stop layer is formed using a selective atomic layer deposition (SALD) process.

15. The method of claim 14, wherein the SALD process comprises a plurality of alternating first and second cycles in which a precursor gas is turned on in the first cycle and an oxidant gas is turned on for the second cycle, and wherein the precursor gas include Tetrakisethylmethylaminohafnium (TEMAHf), Tetrakis(ethylmethylamido)zirconium (TEMA-Zr), Trimethyl Aluminum (TMA), or Tetrakis(dimethylamido) Aluminum (TDMAA).

16. The method of claim 13, wherein the forming of the second interconnect layer includes:

forming a second dielectric layer over the second etching stop layer; and etching an opening in the second dielectric layer, wherein an etching selectivity exists between the first etching layer and the second etching layer during the etching.

17. The method of claim 16, wherein the opening is etched such that the opening is etched through the second etching stop layer but stops at the first etching stop layer.

18. The method of claim 16, wherein the opening is etched such that the opening is partially misaligned with the first conductive layer.

19. The method of claim 13, wherein:

the first etching stop layer is formed to contain hafnium oxide, zirconium oxide, or aluminum oxide; and the second etching stop layer is formed to contain silicon oxycarbide (SiOC) or silicon oxynitride (SiON).

20. The method of claim 13, wherein the first dielectric layer and the first conductive layer have co-planar upper surfaces before the metal capping layer is formed, and wherein the second etching stop layer is formed to be thicker than the first etching stop layer.

* * * * *